US012690417B2

(12) United States Patent
Inoue et al.

(10) Patent No.: US 12,690,417 B2
(45) Date of Patent: Jul. 21, 2026

(54) WAFER PLACEMENT TABLE

(71) Applicant: NGK INSULATORS, LTD.,
Nagoya-City (JP)

(72) Inventors: Seiya Inoue, Handa-City (JP); Tatsuya Kuno, Nagoya-City (JP); Masaki Ishikawa, Handa-City (JP); Taro Usami, Kakamigahara-City (JP); Ren Nakamura, Nagoya-City (JP); Natsuki Hirata, Nagoya-City (JP); Kenji Yonemoto, Tokoname-City (JP)

(73) Assignee: NGK INSULATORS, LTD.,
Nagoya-City (JP)

( * ) Notice: Subject to any disclaimer, the term of this patent is extended or adjusted under 35 U.S.C. 154(b) by 346 days.

(21) Appl. No.: 18/582,759

(22) Filed: Feb. 21, 2024

(65) Prior Publication Data

US 2024/0297062 A1 Sep. 5, 2024

Related U.S. Application Data

(63) Continuation of application No. PCT/JP2023/031890, filed on Aug. 31, 2023.

(30) Foreign Application Priority Data

Jan. 26, 2023 (WO) .................. PCT/JP2023/002417

(51) Int. Cl.
*H10P 72/72* (2026.01)
(52) U.S. Cl.
CPC .................................. *H10P 72/722* (2026.01)
(58) Field of Classification Search
CPC ......... H10P 72/70; H10P 72/72; H10P 72/722
See application file for complete search history.

(56) References Cited

U.S. PATENT DOCUMENTS

| 8,336,891 B2 * | 12/2012 | Goto | ....................... H10P 72/72 |
| | | | 118/728 |
| 2016/0276198 A1 * | 9/2016 | Anada | ................. H10P 72/0434 |

(Continued)

FOREIGN PATENT DOCUMENTS

| JP | 2019-519927 A | 7/2019 |
| JP | 2020-072262 A | 5/2020 |

(Continued)

OTHER PUBLICATIONS

English translation of the International Preliminary Report on Patentability (Chapter I) dated Aug. 7, 2025 (Application No. PCT/JP2023/031890).

(Continued)

*Primary Examiner* — Tyrone V Hall, Jr.
(74) *Attorney, Agent, or Firm* — Muncy, Geissler, Olds & Lowe, P.C.

(57) ABSTRACT

A wafer placement table includes a ceramic plate having a wafer placement surface on its top surface and incorporating an electrode; an electrically conductive plate joined to a bottom surface of the ceramic plate; a ceramic plate penetrating part extending through the ceramic plate; an electrically insulating gas passage plug provided in the ceramic plate penetrating part and that allows gas to pass inside; a gas introduction passage provided at least inside the electrically conductive plate and communicating with the ceramic plate penetrating part; and an electrically conductive gas passage part provided in the gas introduction passage, being in contact with a bottom surface of the electrically insulating gas passage plug, being electrically continuous with the electrically conductive plate, and that allows gas to pass inside.

11 Claims, 11 Drawing Sheets

(56)         References Cited

U.S. PATENT DOCUMENTS

| 2017/0352568 | A1* | 12/2017 | Cho | ........................ | H01J 37/32724 |
| 2019/0099977 | A1* | 4/2019 | Parkhe | ........................ | B32B 3/266 |
| 2020/0135529 | A1 | 4/2020 | Shiraishi et al. | | |
| 2020/0227291 | A1 | 7/2020 | Ishikawa et al. | | |
| 2020/0294838 | A1 | 9/2020 | Yoshikawa et al. | | |

FOREIGN PATENT DOCUMENTS

| JP | 2020-150071 | A | 9/2020 |
| JP | 7149914 | B2 | 10/2022 |
| WO | 2021/241645 | A1 | 12/2021 |

OTHER PUBLICATIONS

International Search Report and Written Opinion (Application No. PCT/JP2023/031890) dated Oct. 31, 2023 (7 pages).
International Search Report and Written Opinion (Application No. PCT/JP2023/002417) dated May 9, 2023 (7 pages).

* cited by examiner

WAFER PLACEMENT TABLE

BACKGROUND OF THE INVENTION

1. Field of the Invention

The present invention relates to a wafer placement table.

2. Description of the Related Art

Hitherto, there is known a wafer placement table that includes a ceramic plate having a wafer placement surface on its top surface and a base plate joined to a bottom surface of the ceramic plate and having a gas introduction passage. In PTL 1, in the thus configured wafer placement table, an electrically insulating first porous portion disposed in a through-hole of the ceramic plate, and an electrically insulating second porous portion fitted to a recess provided on a ceramic plate side of the base plate so as to be opposed to the first porous portion are provided. Gas supplied to the gas introduction passage passes through the second porous portion and the first porous portion and flows into the space between the wafer placement surface and a wafer. The gas is used to cool an object. In the description, with the first porous portion and the second porous portion, while the flow rate of gas from the gas introduction passage to the wafer placement surface is ensured, it is possible to suppress occurrence of discharge (arc discharge) due to plasma at the time when a wafer is processed.

CITATION LIST

Patent Literature

PTL 1: JP 2020-72262 A

SUMMARY OF THE INVENTION

However, even with the electrically insulating second porous portion as described in PTL 1, there has been a case where discharge occurs around a base plate-side end of the first porous portion.

The present invention is made to solve such inconvenience, and it is a main object to suppress discharge around an electrically conductive plate-side end of an electrically insulating gas passage plug.

The present invention employs the following manner to achieve the above-described main object.

[1] A wafer placement table of the present invention includes: a ceramic plate having a wafer placement surface on its top surface and incorporating an electrode; an electrically conductive plate joined to a bottom surface of the ceramic plate; a ceramic plate penetrating part extending through the ceramic plate; an electrically insulating gas passage plug provided at the ceramic plate penetrating part, gas being allowed to pass through an inside of the electrically insulating gas passage plug; a gas introduction passage provided at least inside the electrically conductive plate, the gas introduction passage communicating with the ceramic plate penetrating part; and an electrically conductive gas passage part provided in the gas introduction passage, the electrically conductive gas passage part being in contact with a bottom surface of the electrically insulating gas passage plug, the electrically conductive gas passage part being electrically continuous with the electrically conductive plate, the electrically conductive gas passage part allowing gas to pass inside.

In the wafer placement table, the electrically conductive gas passage part is provided in the gas introduction passage, the electrically conductive gas passage part is in contact with the bottom surface of the electrically insulating gas passage plug, and the electrically conductive gas passage part is electrically continuous with the electrically conductive plate. Thus, in comparison with, for example, a case where an electrically insulating porous member is present on the bottom surface side of the electrically insulating gas passage plug, a potential difference is less likely to occur around an electrically conductive plate-side end of the electrically insulating gas passage plug. Therefore, it is possible to reduce discharge around the electrically conductive plate-side end of the electrically insulating gas passage plug.

[2] In the above-described wafer placement table (the wafer placement table according to [1]), the electrically conductive gas passage part may be provided separately from the electrically conductive plate. Thus, in comparison with, for example, a case where the electrically conductive gas passage part is not provided separately from the electrically conductive plate but a one-piece member, the wafer placement table is easily manufactured. In this case, the electrically conductive gas passage part may be in contact with the electrically conductive plate.

[3] In the above-described wafer placement table (the wafer placement table according to [2]), the electrically conductive gas passage part may have a stretch member, and the stretch member may be pressed against the bottom surface of the electrically insulating gas passage plug to be compressed. Thus, when the stretch member is pressed against the bottom surface of the electrically insulating gas passage plug to be compressed, contact between the electrically conductive gas passage part and the electrically insulating gas passage plug is easily maintained.

[4] In the above-described wafer placement table (the wafer placement table according to [2] or [3]), the electrically conductive gas passage part may have at least one of an electrically conductive mesh or a clump body of electrically conductive fiber. Since an electrically conductive mesh and a clump body of electrically conductive fiber allow gas to easily flow inside, the electrically conductive mesh and the clump body of electrically conductive fiber are suitable for the electrically conductive gas passage part.

[5] In the above-described wafer placement table (the wafer placement table according to any one of [1] to [4]), the electrically conductive gas passage part may have an electrically conductive bulk body having a hole that allows gas to pass in an up and down direction, and a diameter of the hole may be greater than or equal to 0.1 mm and less than or equal to 1 mm. Thus, since the diameter of the hole that allows gas to pass in the up and down direction is greater than or equal to 0.1 mm, the flow rate of gas is less likely to be short. In addition, since the diameter of the hole is less than or equal to 1 mm, a potential difference is less likely to occur in the hole, so it is possible to reduce discharge in the hole.

[6] In the above-described wafer placement table (the wafer placement table according to any one of [1] to [5]), the electrically conductive gas passage part may have an electrically conductive porous body.

[7] In the above-described wafer placement table (the wafer placement table according to any one of [2] to

[6]), the electrically conductive gas passage part may have a structure in which one or more electrically conductive meshes and one or more electrically conductive sheets having a hole that allows gas to pass in an up and down direction are laminated, and a diameter of the hole may be greater than or equal to 0.1 mm and less than or equal to 1 mm.

[8] In the above-described wafer placement table (the wafer placement table according to any one of [1] to [7]), the electrically conductive gas passage part may be disposed so as to overlap an entire bottom surface of the electrically insulating gas passage plug when imaginarily seen through from above. Thus, since the electrically conductive gas passage part is present on the lower side with respect to the entire bottom surface of the electrically insulating gas passage plug, it is possible to further reliably reduce discharge around the electrically conductive plate-side end of the electrically insulating gas passage plug.

[9] In the above-described wafer placement table (the wafer placement table according to any one of [1] to [8]), the electrically insulating gas passage plug may be a porous body.

[10] In the above-described wafer placement table (the wafer placement table according to any one of [1] to [9]), the electrically conductive gas passage part may have a coating layer that coats the bottom surface of the electrically insulating gas passage plug. In this case, the electrically insulating gas passage plug may be a dense plug having a gas internal flow channel, and the coating layer may be a dense layer having a hole that communicates the gas internal flow channel of the dense plug with the gas introduction passage. Alternatively, the coating layer may be a porous layer that coats the bottom surface of the dense plug.

[11] In the above-described wafer placement table (the wafer placement table according to any one of [1] to [10]), the electrically conductive gas passage part may have a coating layer that coats the bottom surface of the electrically insulating gas passage plug and an elastic body that presses the coating layer upward with an elastic force. Thus, contact between the electrically conductive gas passage part and the electrically insulating gas passage plug is easily maintained.

DETAILED DESCRIPTION OF THE INVENTION

Figure 1:
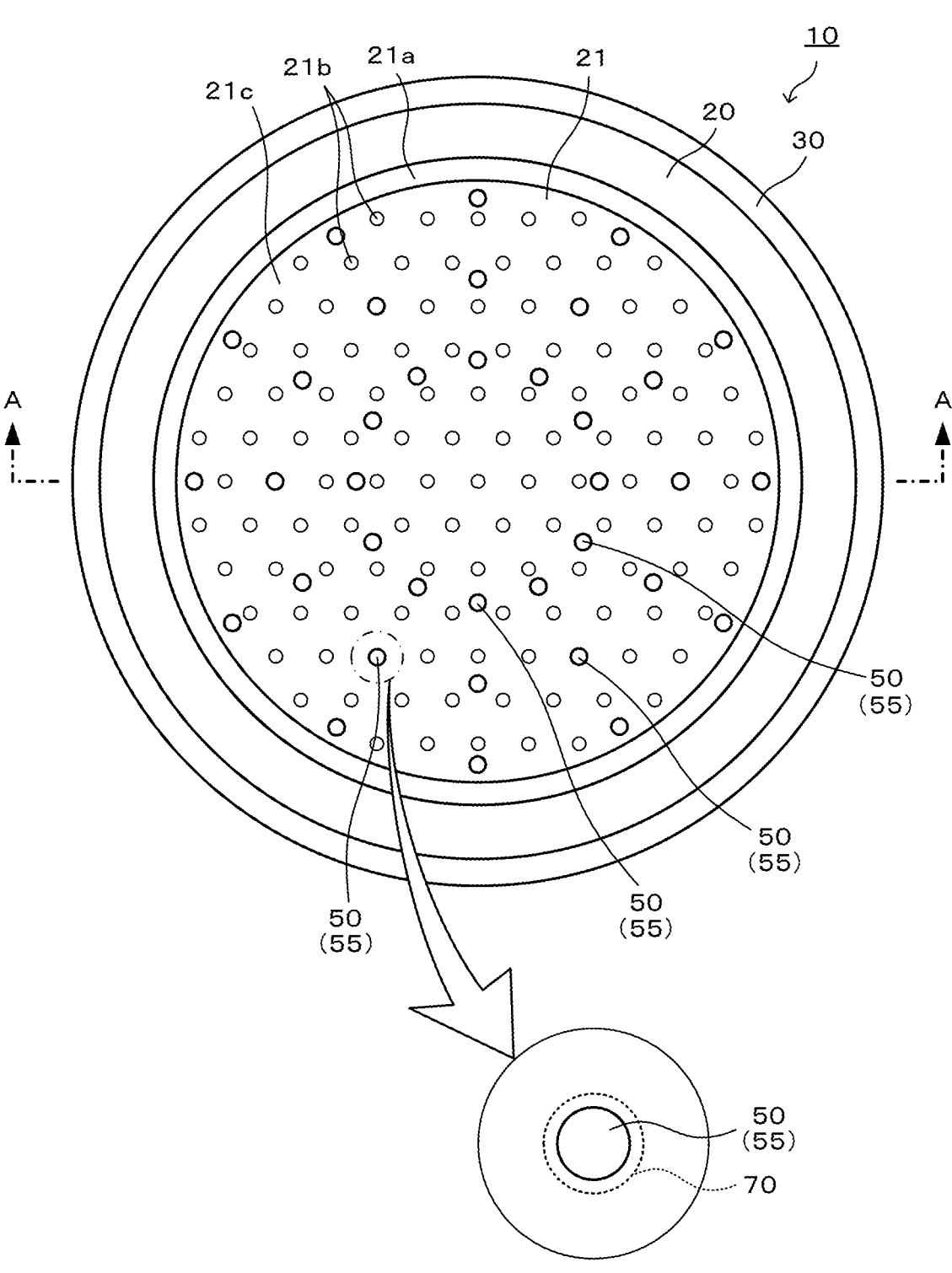
FIG. 1 is a plan view of a wafer placement table 10.
Figure 2:
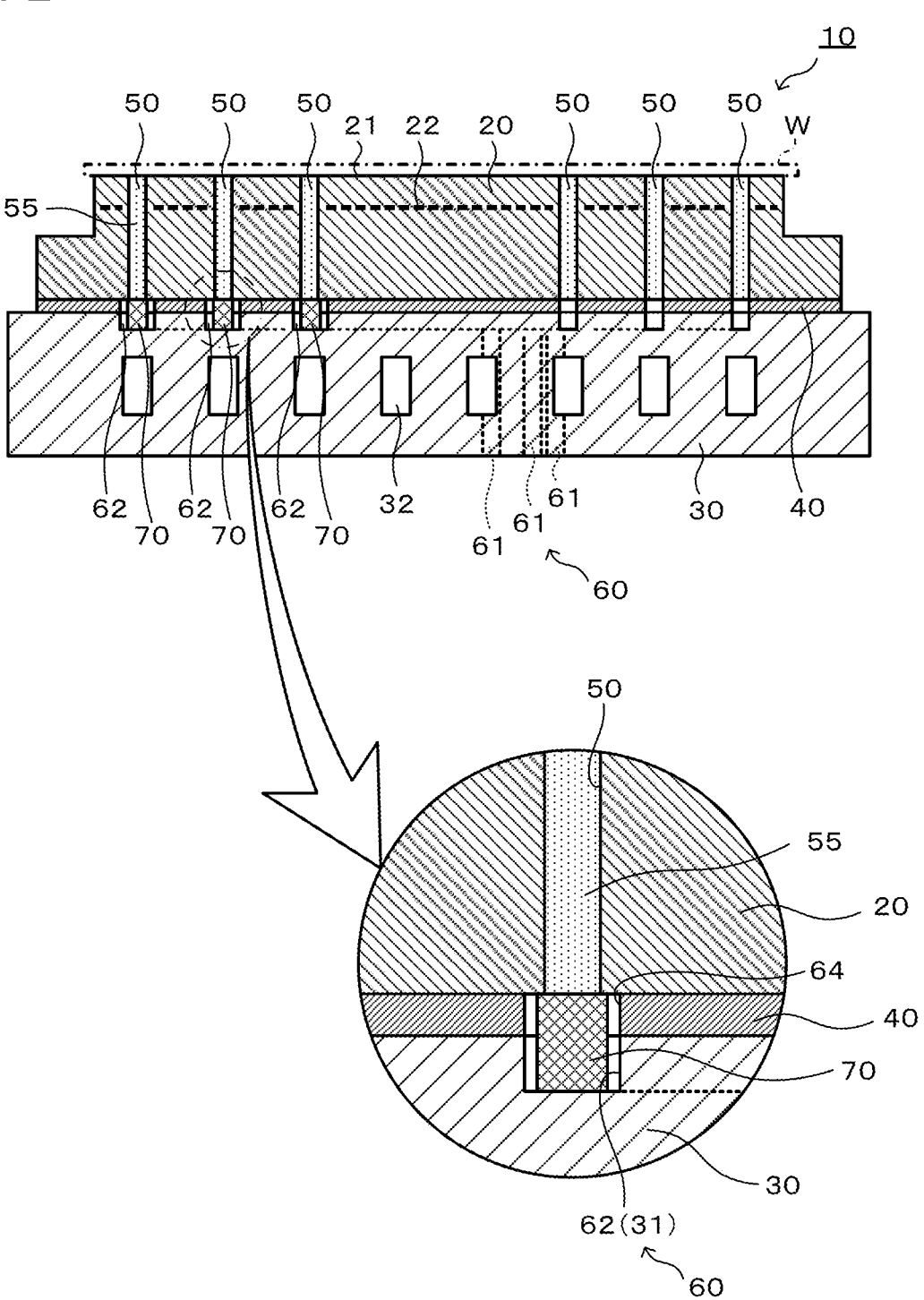
FIG. 2 is a sectional view taken along the line A-A in FIG. 1.
Figure 3:
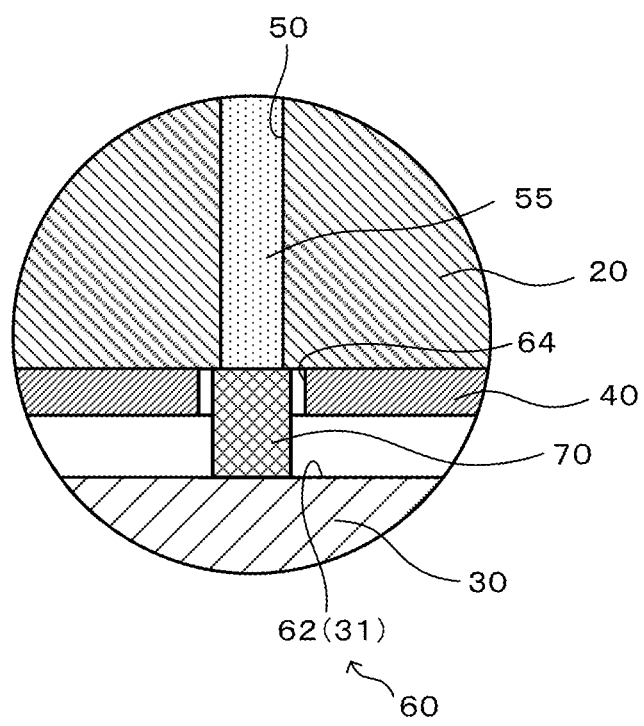
FIG. 3 is a partially enlarged sectional view that shows an area around a gas second passage 62 and an electrically conductive gas passage part 70.
Figure 4:
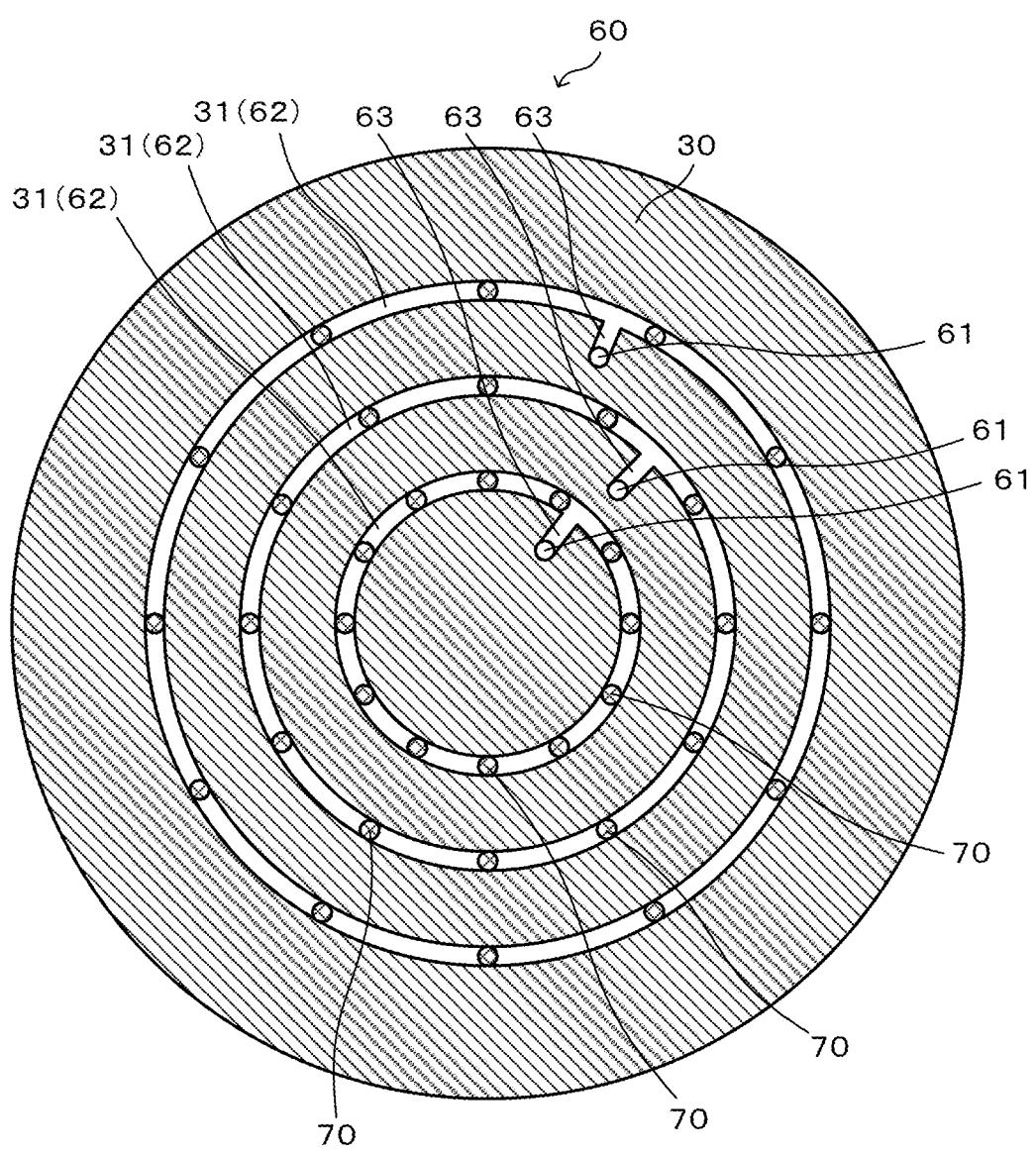
FIG. 4 is a sectional view of the wafer placement table 10, taken along a horizontal plane passing through the gas second passage 62 when viewed from above.
Figure 5:
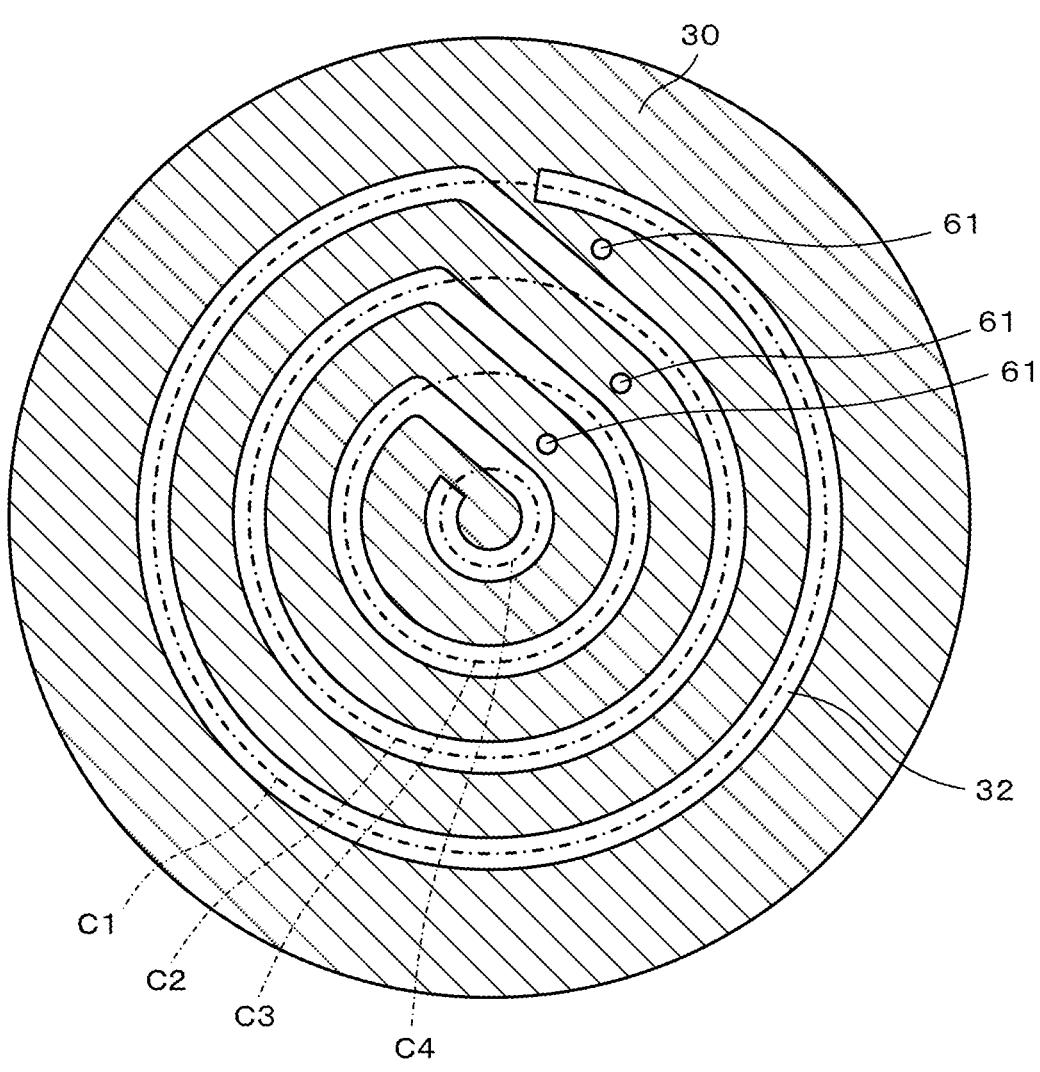
FIG. 5 is a sectional view of the wafer placement table 10, taken along a horizontal plane passing through a refrigerant flow channel 32 when viewed from above.
Figure 6:
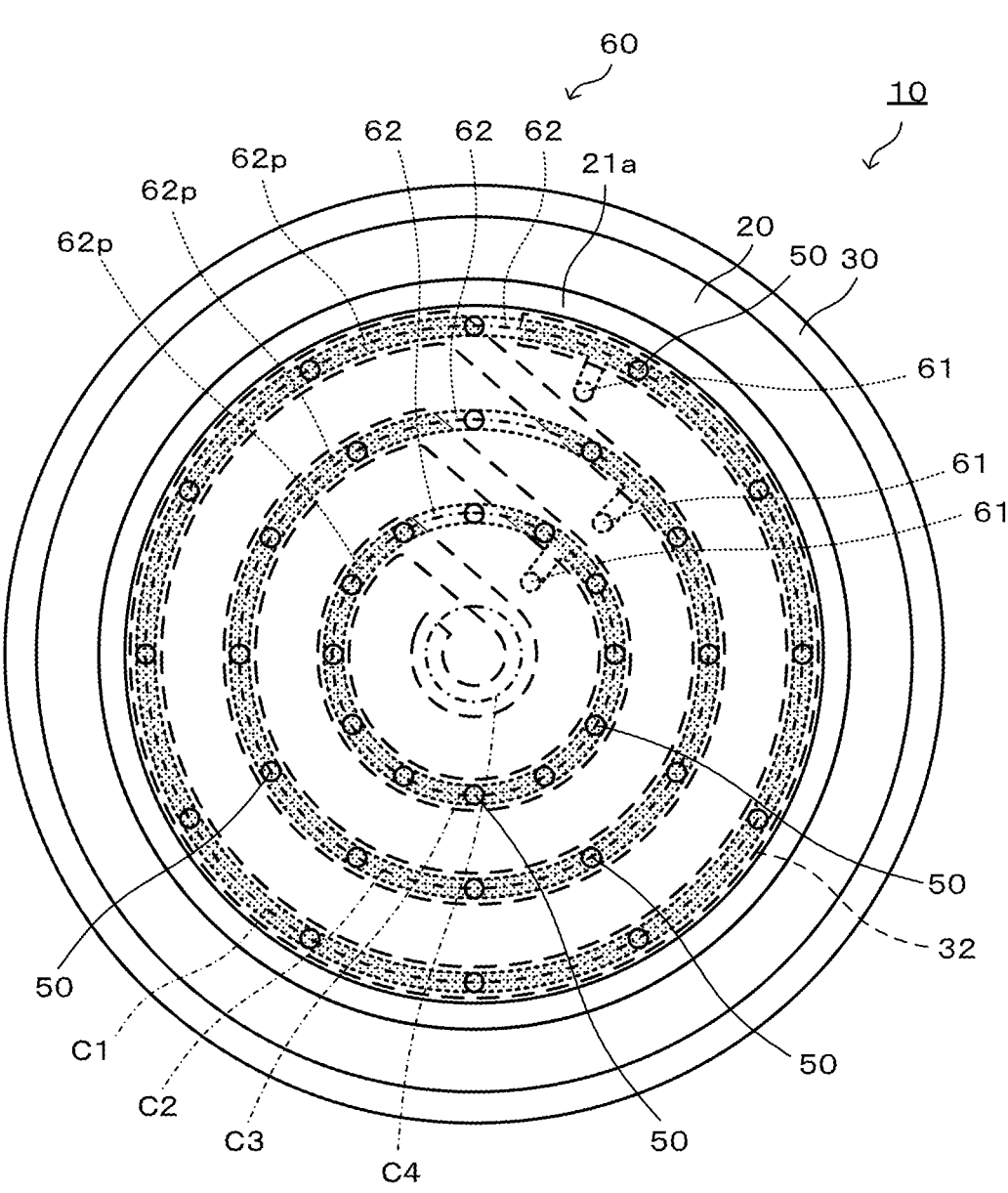
FIG. 6 is a view in which the refrigerant flow channel 32 and the like are drawn in the plan view of the wafer placement table 10.

Next, an embodiment of the present invention will be described with reference to the accompanying drawings. FIG. 1 is a plan view of a wafer placement table 10. FIG. 2 is a sectional view taken along the line A-A in FIG. 1. FIG. 3 is a partially enlarged sectional view that shows an area around a gas second passage 62 and an electrically conductive gas passage part 70. FIG. 4 is a sectional view of the wafer placement table 10, taken along a horizontal plane passing through the gas second passage 62 when viewed from above. FIG. 5 is a sectional view of the wafer placement table 10, taken along a horizontal plane passing through a refrigerant flow channel 32 when viewed from above. FIG. 6 is a view in which the refrigerant flow channel 32 and the like are drawn in the plan view of the wafer placement table 10. The partially enlarged view in FIG. 1 is a view in which the electrically conductive gas passage part 70 is drawn in the plan view of the wafer placement table 10. FIG. 3 is a partially enlarged sectional view of the wafer placement table 10, taken along a perpendicular plane along the gas second passage 62 and a perpendicular plane passing through the electrically conductive gas passage part 70. In the specification, the words "up" and "down" do not indicate an absolute positional relationship. Therefore, depending on the orientation of the wafer placement table 10, "up" and "down" can be "down" and "up" or can be "left" and "right" or can be "front" and "rear".

As shown in FIG. 2, the wafer placement table 10 includes a ceramic plate 20, an electrically conductive plate 30, an electrically conductive bonding layer 40, ceramic plate penetrating parts 50, a gas introduction passage 60, and electrically conductive gas passage parts 70.

The ceramic plate 20 is a ceramic disk (for example, a diameter of 300 mm and a thickness of 5 mm), such as alumina sintered body and aluminum nitride sintered body. The upper surface of the ceramic plate 20 is a wafer placement surface 21 on which a wafer W is placed. The ceramic plate 20 incorporates an electrode 22. As shown in FIG. 1, on the wafer placement surface 21 of the ceramic plate 20, an annular seal band 21a is formed along the outer edge, and a plurality of circular small projections 21b is formed all over the surface on the inner side of the seal band 21a. The seal band 21a and the circular small projections 21b have the same height and have a height of, for example, several micrometers to several tens of micrometers. The electrode 22 is a planar mesh electrode used as an electrostatic electrode and is connected to an external direct-current power supply via a power supply member (not shown). A low pass filter is disposed in the middle of the power supply member. The power supply member is electrically insulated from the electrically conductive bonding layer 40 and the electrically conductive plate 30. When a direct-current voltage is applied to the electrode 22, a wafer W is attracted and fixed to the wafer placement surface 21 (specifically, the upper surface of the seal band and the upper surfaces of the circular small projections) by electrostatic attraction force. When application of direct-current voltage is stopped, attraction and fixation of the wafer W to the wafer placement surface 21 are released. Part of the wafer placement surface 21 where the seal band 21a or the circular small projections 21b are not provided is referred to as a reference surface 21c.

The electrically conductive plate 30 is a disk having good thermal conductivity (a disk having a diameter equal to or greater than the diameter of the ceramic plate 20). The refrigerant flow channel 32 in which refrigerant circulates is formed in the electrically conductive plate 30. Refrigerant flowing through the refrigerant flow channel 32 is preferably liquid and preferably has electrically insulating properties. Examples of the liquid having electrically insulating properties include fluoroinert fluid. The refrigerant flow channel 32 is formed in a one-stroke pattern from one end (inlet) to the other end (outlet) over the entire area of the electrically conductive plate 30 in plan view. As shown in FIG. 5, the refrigerant flow channel 32 is provided so as to be routed in a one-stroke pattern from one end to the other end in accordance with multiple circles disposed such that a plurality of imaginary circles (alternate long and short-dashed line circles C1 to C4; here, the circles C1 to C4 are concentric circles) having different diameters in plan view. Specifically, to route the refrigerant flow channel 32 in a one-stroke pattern from one end to the other end, the refrigerant flow channel 32 is routed so as to trace the imaginary circles while connecting two inner and outer imaginary circles of the multiple circles. A supply port and collection port of an external refrigerant apparatus (not shown) are respectively connected to one end and the other end of the refrigerant flow channel 32. Refrigerant supplied from the supply port of the external refrigerant apparatus to one end of the refrigerant flow channel 32 passes through the refrigerant flow channel 32 and then returns to the collection port of the external refrigerant apparatus from the other end of the refrigerant flow channel 32, the refrigerant is adjusted in temperature, and then the refrigerant is supplied to one end of the refrigerant flow channel 32 through the supply port again. The electrically conductive plate 30 is connected to a radio-frequency (RF) power supply and is also used as an RF electrode.

Examples of the material of the electrically conductive plate 30 include a metal material and a composite material of metal and ceramics. Examples of the metal material include Al, Ti, Mo, and alloys of them. Examples of the composite material of metal and ceramics include a metal matrix composite material (MMC) and a ceramic matrix composite material (CMC). Specific examples of such composite materials include a material including Si, SiC, and Ti (also referred to as SiSiCTi), a material obtained by impregnating an SiC porous body with Al and/or Si, and a composite material of $Al_2O_3$ and TiC. A material having a coefficient of thermal expansion close to that of the material of the ceramic plate 20 is preferably selected as the material of the electrically conductive plate 30.

The electrically conductive bonding layer 40 is, for example, a metal bonding layer and bonds the lower surface of the ceramic plate 20 with the upper surface of the electrically conductive plate 30. The electrically conductive bonding layer 40 is formed by, for example, TCB (thermal compression bonding). TCB is a known method of sandwiching a metal bonding material between two members to be bonded and bonding the two members in a state of being heated to a temperature lower than or equal to a solidus temperature of the metal bonding material while applying pressure.

As shown in FIG. 2, the ceramic plate penetrating parts 50 are holes that extend through the ceramic plate 20 in an up and down direction. The ceramic plate penetrating parts 50 are passages of gas from a bottom surface of the ceramic plate 20 to a reference surface 21c (FIG. 1) of a wafer placement surface 21. As shown in FIG. 1, the plurality of (here, 36) ceramic plate penetrating parts 50 is provided. Each ceramic plate penetrating part 50 has an electrically insulating porous plug 55 that allows flow of gas. Here, the porous plug 55 is fixed so as to fill the ceramic plate penetrating part 50. Specifically, the outer peripheral surface of the porous plug 55 and the inner peripheral surface of the ceramic plate penetrating part 50 may be bonded to each other, or an external thread portion provided on the outer peripheral surface of the porous plug 55 may be screwed to an internal thread portion provided on the inner peripheral surface of the ceramic plate penetrating part 50. The top surface of the porous plug 55 is located at the same level with the reference surface 21c of the wafer placement surface 21. The bottom surface of the porous plug 55 is located at the same level with the bottom surface of the ceramic plate 20. A porous bulk body obtained by sintering using ceramic powder may be used as the porous plug 55. For example, alumina, aluminum nitride, or the like may be used as ceramics. The porous plug 55 preferably has a porosity of higher than or equal to 30% and preferably has a mean pore size of greater than or equal to 20 μm. The porosity of the porous plug 55 may be lower than or equal to 70%.

The gas introduction passage 60 is provided at least inside the electrically conductive plate 30 and is a passage of gas, which communicates with the ceramic plate penetrating parts 50. The gas introduction passage 60 includes gas first passages 61, gas second passages 62, gas auxiliary passages 63 (FIG. 4), and bonding layer penetrating parts 64. The gas introduction passage 60 includes gas passages (the gas first passages 61, the gas second passages 62, and the gas auxiliary passages 63) provided in the electrically conductive plate 30, and gas passages (bonding layer penetrating parts 64) provided in the electrically conductive bonding layer 40.

The gas first passages 61 extend through the electrically conductive plate 30 in the up and down direction. The gas first passages 61 extend through the electrically conductive plate 30 in the up and down direction between parts of the refrigerant flow channel 32. The plurality of (hereinafter, three) gas first passages 61 is provided.

The gas second passages 62 are provided parallel to the wafer placement surface 21 at the interface between the electrically conductive bonding layer 40 and the electrically conductive plate 30. The state "parallel" includes not only a completely parallel state but also a state that falls within the range of an allowable error (for example, tolerance) even when the state is not completely parallel. The gas second passages 62 each have a recessed groove 31 (first recessed portion) provided on the top surface of the electrically conductive plate 30 and each are formed when the top surface of the recessed groove 31 is covered with the electrically conductive bonding layer 40. As shown in FIG. 6, each of the gas second passages 62 is provided in an annular shape so as to overlap any one of the plurality of imaginary circles C1 to C4 in a plan view. Specifically, of the three gas second passages 62, the first gas second passage 62 from the outer periphery of the wafer placement table 10 overlaps the imaginary circle C1 with the greatest diameter, the second gas second passage 62 overlaps the imaginary circle C2 with the second greatest diameter, and the third gas second passage 62 overlaps the imaginary circle C3 with the third greatest diameter. Each of the gas second passages 62 has an overlapping part 62p (the shaded parts in FIG. 6) that overlaps the refrigerant flow channel 32 along the refrigerant flow channel 32 in a plan view.

Each of the gas auxiliary passages 63 is a passage that connects the gas first passage 61 with the gas second passage 62 and is provided parallel to the wafer placement surface 21 at the interface between the electrically conductive bonding layer 40 and the electrically conductive plate 30. The plurality of (here, 12) ceramic plate penetrating parts 50 is provided for each gas second passage; however, the number of the gas first passages 61 and the number of the gas auxiliary passages 63 are less than the number of the ceramic plate penetrating parts 50 (here, one for each gas second passage 62).

As shown in FIG. 2, the bonding layer penetrating part 64 is a hole that extends through the electrically conductive bonding layer 40 in the up and down direction. The bonding layer penetrating part 64 is a passage of gas that extends from the top surface of the electrically conductive plate 30 to the bottom surface of the ceramic plate 20. The plurality of (here, 36) bonding layer penetrating parts 64 is disposed in a one-to-one correspondence with the ceramic plate penetrating part 50. In the present embodiment, the diameter of the bonding layer penetrating part 64 is equal to or greater than the diameter of the ceramic plate penetrating part 50. The diameter of the bonding layer penetrating part 64 is equal to or greater than the diameter of the electrically conductive gas passage part 70.

Each of the electrically conductive gas passage parts 70 is provided in the gas introduction passage 60 and provided so as to be in contact with the bottom surface of the porous plug 55. In the present embodiment, the electrically conductive gas passage parts 70 are provided separately from the electrically conductive plate 30, and the bottom surfaces are in contact with the electrically conductive plate 30. More specifically, each of the electrically conductive gas passage parts 70 is provided over the inside of the bonding layer penetrating part 64 and the inside of the gas second passage 62 in the gas introduction passage 60 and is in contact with the electrically conductive plate 30 at a portion just below the bonding layer penetrating part 64 on the bottom surface (base end surface) of the gas second passage 62 (recessed groove 31). The electrically conductive gas passage parts 70 are in contact with the electrically conductive plate 30, so the electrically conductive gas passage parts 70 are electrically continuous with the electrically conductive plate 30. The plurality of (here, 36) electrically conductive gas passage parts 70 is provided and is disposed in a one-to-one correspondence with the porous plugs 55. In the present embodiment, the electrically conductive gas passage part 70 is a substantially circular columnar member having a circular shape in a top view.

The electrically conductive gas passage part 70 is a member that allows gas to pass inside. Therefore, gas in the gas introduction passage 60 is allowed to pass inside the electrically conductive gas passage part 70 and flow to the ceramic plate penetrating part 50. Examples of the member that allows gas to pass inside include an electrically conductive mesh and a clump body of electrically conductive fiber. Examples of the material of the electrically conductive gas passage part 70 include a metal material and carbon. Examples of the metal material include Al, Ti, Mo, alloys of them, and steel. Examples of the clump body of electrically conductive fiber include steel wool and carbon felt. When the electrically conductive gas passage part 70 is an electrically conductive mesh, the opening size may be greater than or equal to 0.062 mm (250 mesh) and less than or equal to 0.154 mm (100 mesh).

The electrically conductive gas passage part 70 is preferably a stretch member. For example, the above-described electrically conductive mesh and clump body of electrically conductive fiber are examples of the stretch member. When a stretch of the electrically conductive gas passage part 70 has a directivity, it is preferably stretchable at least in the up and down direction. The electrically conductive gas passage part 70 is preferably pressed against the bottom surface of the porous plug 55 to be compressed. In the present embodiment, the electrically conductive gas passage part 70 is a stretch member, and the electrically conductive gas passage part 70 is pressed against the bottom surface of the porous plug 55 to be compressed up and down between the porous plug 55 and the electrically conductive plate 30.

The electrically conductive gas passage part 70 is preferably disposed so as to overlap the entire bottom surface of the porous plug 55 when imaginarily seen through from above. In the present embodiment, as shown in the partially enlarged view of FIG. 1, the diameter of the electrically conductive gas passage part 70 is greater than the diameter of the porous plug 55, and the entire bottom surface of the porous plug 55 is included in the electrically conductive gas passage part 70 when imaginarily seen through from above.

The conductance of the electrically conductive gas passage part 70 is preferably greater than the conductance of the porous plug 55, and the conductance of the electrically conductive gas passage part 70 is preferably greater than or equal to twice the conductance of the porous plug 55. A conductance can be, for example, calculated by dividing the amount (flow rate) of gas flowing inside per unit time by a pressure difference between a gas inflow side and a gas outflow side. When the conductance is compared between the electrically conductive gas passage part 70 and the porous plug 55, each conductance is calculated by supplying gas at the same pressure to each of the electrically conductive gas passage part 70 and the porous plug 55. When, for example, the electrically conductive gas passage part 70 is an electrically conductive mesh, adjustment of the conductance of the electrically conductive gas passage part 70 can be performed by adjustment of the opening size. When, the electrically conductive gas passage part 70 is a clump body of electrically conductive fiber, adjustment of the conductance of the electrically conductive gas passage part 70 can be performed by adjustment of the width of fiber and/or the porosity in the clump body.

Next, an example of use of the thus configured wafer placement table 10 will be described. Initially, in a state where the wafer placement table 10 is placed in a chamber (not shown), a wafer W is mounted on the wafer placement surface 21. Then, the inside of the chamber is decompressed by a vacuum pump and adjusted into a predetermined degree of vacuum, electrostatic attraction force is generated by applying a direct-current voltage to the electrode 22 of the ceramic plate 20, and the wafer W is attracted and fixed to the wafer placement surface 21 (specifically, the top surface of the seal band 21*a* or the top surfaces of the circular small projections 21*b*). Subsequently, the inside of the chamber is set to a reaction gas atmosphere with a predetermined pressure (for example, several tens to several hundreds of pascals). In this state, plasma is generated by applying an RF voltage between an upper electrode (not shown) provided at a ceiling part in the chamber and the electrically conductive plate 30 of the wafer placement table 10. The surface of the wafer W is processed by the generated plasma. Refrigerant circulates through the refrigerant flow channel 32 of the electrically conductive plate 30. Back-side gas is introduced from a gas cylinder (not shown) to the gas first passages 61 of the gas introduction passage 60. Heat transfer gas (for example, He gas or the like) may be used as the back-side gas. Back-side gas introduced into the gas first passages 61 is distributed to the plurality of ceramic plate penetrating parts 50 through the gas auxiliary passages 63, the gas second passages 62, and the electrically conductive gas passage parts 70 in this order and supplied into the space between the back side of the wafer W and the reference surface 21*c* of the wafer placement surface 21 to be encapsulated. With the presence of the back-side gas, heat transfer between the wafer W and the ceramic plate 20 is efficiently performed. Since the porous plug 55 is provided in the ceramic plate penetrating part 50, it is possible to reduce discharge in the ceramic plate penetrating part 50. If, for example, the porous plug 55 is not provided, electrons generated as a result of ionization of gas molecules by application of RF voltage accelerate and collide with other gas particles to cause glow discharge and, by extension, arc discharge. However, when the porous plug 55 is provided, electrons collide with the porous plug 55 before colliding with other gas particles, so electrical discharge is suppressed.

Figures 7A, 7B, 7C, 7D, 7E, 7F:
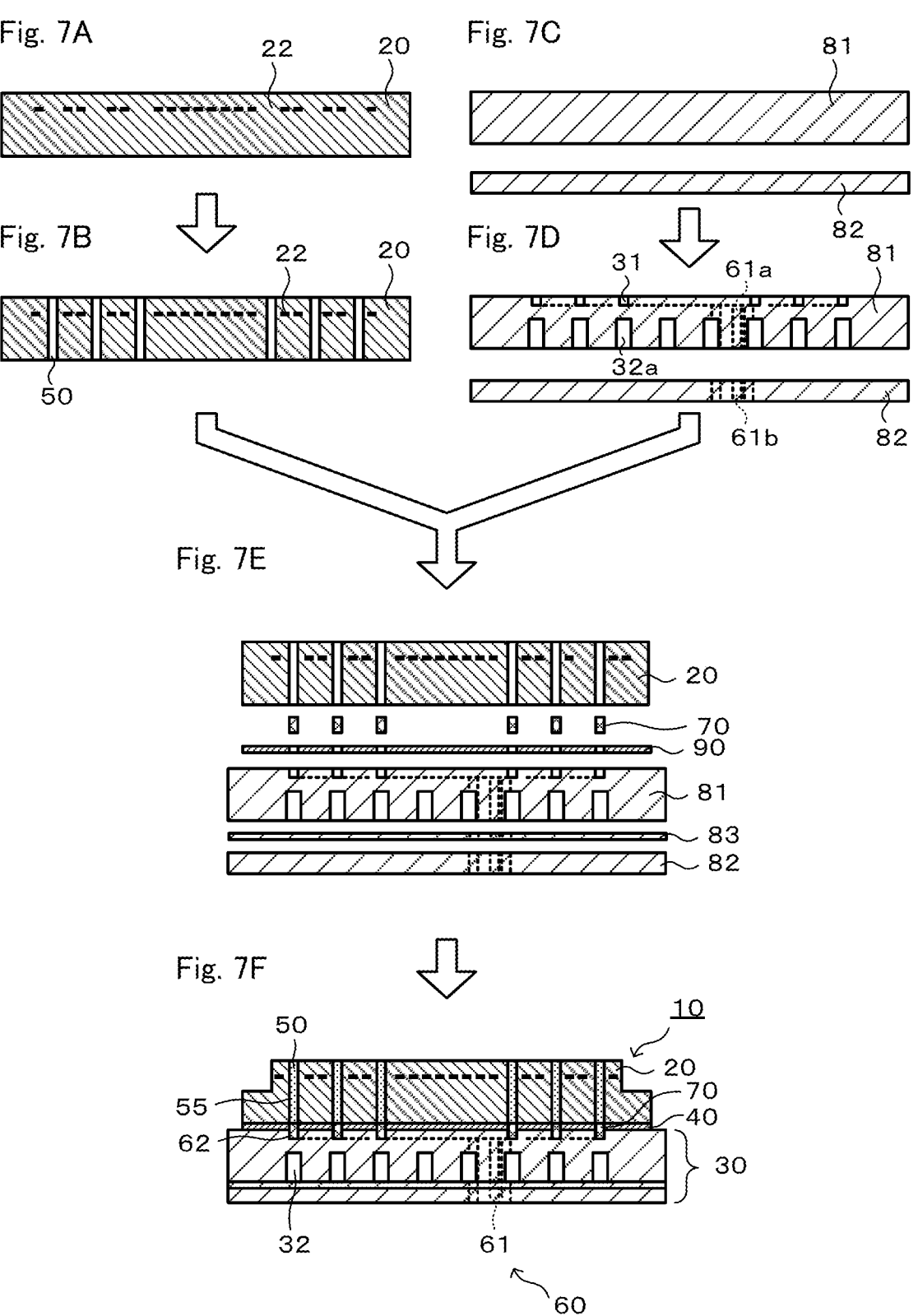
FIGS. 7A to 7F are manufacturing process charts of the wafer placement table 10.

Next, an example of manufacture of the wafer placement table 10 will be described with reference to FIGS. 7A to 7F. FIGS. 7A to 7F are manufacturing process charts of the wafer placement table 10. Here, the case in which the electrically conductive plate 30 is made from an MMC will be illustrated. First, the ceramic plate 20 incorporating the electrode 22 is prepared (FIG. 7A). For example, a molded body of ceramic powder, incorporating the electrode 22, is made, and the ceramic plate 20 is obtained by firing the molded body by hot pressing. The ceramic plate penetrating parts 50 are formed in the ceramic plate 20 (FIG. 7B). The ceramic plate penetrating parts 50 are formed so as to extend through the ceramic plate 20 in the up and down direction off the electrode 22.

Concurrently, two MMC disk members 81, 82 are prepared (FIG. 7C). Grooves and holes are formed as needed in the MMC disk members 81, 82 by machining (FIG. 7D). Specifically, recessed grooves 32*a* that will be finally the refrigerant flow channels 32 are formed on the bottom surface of the upper-side MMC disk member 81, and recessed grooves 31 that will be finally the gas second passages 62 are formed on the top surface of the MMC disk member 81. Through-holes 61*a* that will be finally parts of the gas first passages 61 are formed so as to extend from the recessed grooves 31 to the bottom surface of the MMC disk member 81. In addition, through-holes 61*b* that will be finally parts of the gas first passages 61 are formed in the lower-side MMC disk member 82. When the ceramic plate 20 is made of alumina, the MMC disk members 81, 82 are preferably made of SiSiCTi or AlSiC. This is because the coefficient of thermal expansion of alumina and the coefficient of thermal expansion of SiSiCTi or AlSiC are almost the same.

The disk member made of SiSiCTi can be made by, for example, as follows. Initially, a powder mixture is made by mixing silicon carbide, metal Si and metal Ti. After that, a disk-shaped molded body is made by uniaxial pressing of the obtained powder mixture, and the molded body is sintered by hot pressing in an inert atmosphere, with the result that the disk member made of SiSiCTi is obtained.

Subsequently, after the ceramic plate 20, the MMC disk member 81, and the MMC disk member 82 are bonded by TCB, the overall shape is adjusted, and the porous plugs 55 are attached, with the result that the wafer placement table 10 is obtained (FIGS. 7E and 7F). Specifically, a laminated body is obtained by sandwiching a metal bonding material 83 between the top surface of the lower-side MMC disk member 82 and the bottom surface of the upper-side MMC disk member 81, and sandwiching a metal bonding material 90 between the top surface of the upper-side MMC disk member 81 and the bottom surface of the ceramic plate 20. Through-holes that will be finally parts of the gas first passages 61 are formed in advance in the metal bonding material 83, and through-holes that will be finally the bonding layer penetrating parts 64 are formed in advance in the metal bonding material 90. After the metal bonding material 90 is disposed on the top surface of the MMC disk member 81, the electrically conductive gas passage parts 70 are inserted in advance into the through-holes that will be the bonding layer penetrating parts 64 and inside the recessed grooves 31 just below them. Subsequently, the laminated body is pressurized at a temperature lower than or equal to a solidus temperature of the metal bonding materials 83, 90 (for example, higher than or equal to a temperature obtained by subtracting 20° C. from the solidus temperature and lower than or equal to the solidus temperature) to perform bonding, after that the temperature is returned to a room temperature. Thus, the two MMC disk members 81, 82 are bonded by the metal bonding material 83 into the electrically conductive plate 30. The ceramic plate 20 and the electrically conductive plate 30 are bonded by the metal bonding material 90. The metal bonding material 90 becomes the electrically conductive bonding layer 40. An Al—Mg bonding material or an Al—Si—Mg bonding material may be used as the metal bonding materials 83, 90 at this time. When, for example, TCB is performed by using an Al—Si—Mg bonding material, the laminated body is pressurized in a state of being heated in a vacuum atmosphere. The metal bonding materials 83, 90 with a thickness of about 100 μm are preferable.

Attachment of the porous plugs 55 may be performed by, for example, preparing the porous plugs 55 formed by firing in advance, adhesive is applied to the ceramic plate penetrating parts 50, and then the porous plugs 55 are inserted from the upper side of the ceramic plate penetrating parts 50 to fixedly bond the outer peripheral surfaces of the porous plugs 55 and the inner peripheral surfaces of the ceramic plate penetrating parts 50. Alternatively, attachment of the porous plugs 55 may be performed by forming an external thread portion on the outer peripheral surface of each porous plug 55, forming an internal thread portion on the inner peripheral surface of each ceramic plate penetrating part 50, and inserting each of the porous plugs 55 to be screwed into a corresponding one of the ceramic plate penetrating parts 50 to screw the external thread portion of the porous plug 55 with the internal thread portion of the ceramic plate penetrating part 50. When the porous plug 55 is inserted into the ceramic plate penetrating part 50, insertion is performed until at least the bottom surface of the porous plug 55 contacts with the electrically conductive gas passage part 70.

When the porous plug 55 is inserted into the ceramic plate penetrating part 50, the porous plug 55 may be inserted such that not only the porous plug 55 contacts with the electrically conductive gas passage part 70 but also the porous plug 55 presses the electrically conductive gas passage part 70 downward until the electrically conductive gas passage part 70 is compressed. Thus, it is possible to further reliably bring the electrically conductive gas passage part 70 into contact with the bottom surface of the porous plug 55. Since the electrically conductive gas passage part 70 is compressed in the manufactured wafer placement table 10, contact between the electrically conductive gas passage part 70 and the porous plug 55 is further easily maintained. In this case, for example, the electrically conductive gas passage part 70 may be disposed such that the top end of the electrically conductive gas passage part 70 is inserted in the ceramic plate penetrating part 50 in a state before the porous plug 55 is attached (before the electrically conductive gas passage part 70 is compressed). Thus, it is possible to easily press the electrically conductive gas passage part 70 with the porous plug 55 at the time of inserting the porous plug 55.

In the wafer placement table 10 described in detail above, the electrically conductive gas passage part 70 is provided in the gas introduction passage 60 (here, in the gas second passage 62 and in the bonding layer penetrating part 64), the electrically conductive gas passage part 70 is in contact with the bottom surface of the porous plug 55, and the electrically conductive gas passage part 70 is electrically continuous with the electrically conductive plate 30. For this reason, since the electrically conductive gas passage part 70 having the same potential as the electrically conductive plate 30 is in contact with the porous plug 55, it is possible to reduce discharge in an area around the electrically conductive plate 30-side end of the porous plug 55, that is, an area around the lower end of the porous plug 55. It is also possible to reduce discharge in an area around the lower end of the porous plug 55 even when, for example, an electrically insulating porous member is present instead of the electrically conductive gas passage part 70 on the bottom surface of the porous plug 55; however, a potential difference is less likely to occur in an area around the electrically conductive plate 30-side end of the porous plug 55 when the electrically conductive gas passage part 70 is present, so it is possible to further reduce discharge. Thus, with the wafer placement table 10 according to the present embodiment, in comparison with a case where an electrically insulating porous member is present instead of the electrically conductive gas passage part 70, it is possible to, for example, increase the power of a radio-frequency (RF) power supply connected to the electrically conductive plate 30. There is a demand for increasing the gas pressure of back-side gas for the purpose of further increasing the efficiency of heat transfer between a wafer W and the ceramic plate 20; however, discharge generally more easily occurs when the gas pressure is increased. With the wafer placement table 10 according to the present embodiment, since it is possible to further reduce discharge with the electrically conductive gas passage part 70, the gas pressure can be increased as compared to a case where an electrically insulating porous member is present instead of the electrically conductive gas passage part 70. When the gas pressure is the same, it is possible to reduce discharge even when a space (gap) inside the electrically conductive gas passage part 70 is large as compared to the pores of the electrically insulating porous member, so filling of gas early completes, and the gas pressure is easily controlled to a constant value.

The electrically conductive gas passage part 70 is a member different from the electrically conductive plate 30 and is in contact with the gas introduction passage 60. Therefore, in comparison with, for example, a case where the electrically conductive gas passage part 70 is not provided separately from the electrically conductive plate 30 and is a one-piece member with the electrically conductive plate 30, it is easy to manufacture the wafer placement table 10.

Furthermore, the electrically conductive gas passage part 70 is a stretch member and is pressed against the bottom surface of the porous plug 55 to be compressed. Therefore, contact between the electrically conductive gas passage part 70 and the porous plug 55 is easily maintained.

Furthermore, the electrically conductive gas passage part 70 is made from an electrically conductive mesh or a clump body of electrically conductive fiber. Therefore, gas is allowed to easily flow inside the electrically conductive gas passage part 70.

The electrically conductive gas passage part 70 is disposed so as to overlap the entire bottom surface of the porous plug 55 when imaginarily seen through from above. Therefore, since the electrically conductive gas passage part 70 is present on the lower side for the entire bottom surface of the porous plug 55, it is possible to further reliably reduce discharge in an area around the electrically conductive plate 30-side end of the porous plug 55.

The present invention is not limited to the above-described embodiment and may be, of course, implemented in various modes within the technical scope of the present invention.

Figure 8:
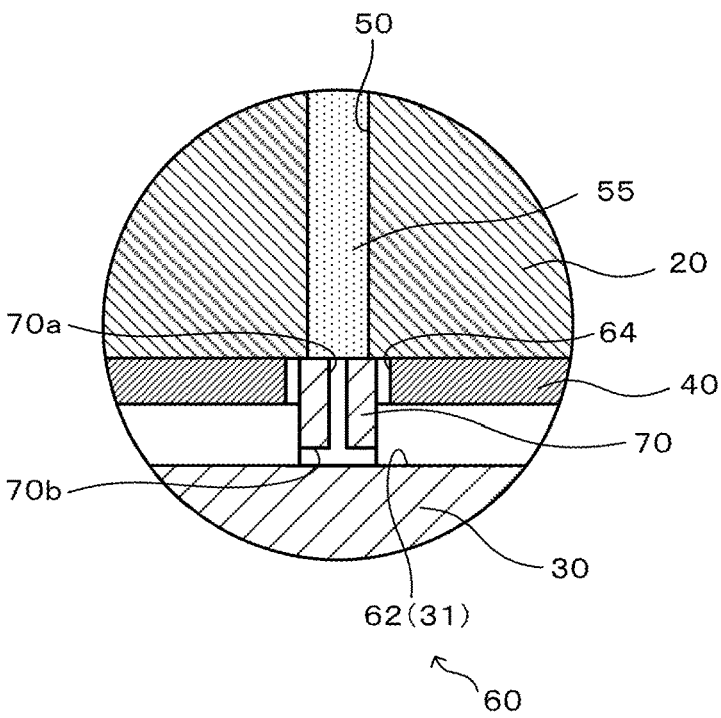
FIG. 8 is a partially enlarged sectional view that shows another example of the electrically conductive gas passage part 70.

In the above-described embodiment, the electrically conductive gas passage part 70 may be an electrically conductive bulk body that is open toward the bottom surface of the porous plug 55 and that allows gas to pass in the up and down direction. For example, as shown in FIG. 8, the electrically conductive gas passage part 70 may be an electrically conductive bulk body having a hole 70*a* that is open toward the bottom surface of the porous plug 55 and that allows gas to pass in the up and down direction and a recessed groove 70*b* that is provided on the bottom surface of the electrically conductive gas passage part 70 and that is horizontally open in the gas second passage 62. The bottom surface of the electrically conductive gas passage part 70 of FIG. 8 is in contact with the electrically conductive plate 30. In the electrically conductive gas passage part 70, gas is allowed to pass through the internal hole 70*a* and the recessed groove 70*b*. In this case, the diameter of the hole 70*a* is preferably greater than or equal to 0.1 mm and less than or equal to 1 mm. When the diameter of the hole 70*a* is greater than or equal to 0.1 mm, the flow rate of gas is less likely to be short. When the diameter of the hole 70*a* is less than or equal to 1 mm, a potential difference is less likely to occur in the hole 70*a*, so it is possible to reduce discharge in the hole 70*a*. The width and depth of the recessed groove 70*b* are also preferably greater than or equal to 0.1 mm from the viewpoint of the flow rate of gas. The width and depth of the recessed groove 70*b* are less likely to influence discharge; however, the width and depth of the recessed groove 70*b* may be made less than or equal to 1 mm. At least one of the hole 70*a* or the recessed groove 70*b* may be provided in multiple number. Examples of the material of the electrically conductive bulk body include metals listed as the material of the electrically conductive plate 30 and a composite material of metal and ceramics in addition to metal materials and carbon listed as the material of the above-described electrically conductive gas passage part 70. The electrically conductive gas passage part 70 and the electrically conductive plate 30 may be made of the same material. When the electrically conductive gas passage part 70 is an electrically conductive bulk body, adjustment of the conductance of the electrically conductive gas passage part 70 can be performed by, for example, adjusting the dimension and/or the number of at least one of the hole 70a or the recessed groove 70b.

In the above-described embodiment, the electrically conductive gas passage part 70 may be not provided separately from the electrically conductive plate 30 but a one-piece member with the electrically conductive plate 30. For example, the electrically conductive gas passage part 70 of the electrically conductive bulk body shown in FIG. 8 may be part of the electrically conductive plate 30. In this case, the electrically conductive gas passage part 70 is formed as a projection provided on the top surface of the electrically conductive plate 30.

In the above-described embodiment, the electrically conductive gas passage part 70 may be an electrically conductive porous body. For example, an electrically conductive porous material is SiC, SiSiC, or the like. A mean pore size of the electrically conductive porous body may be greater than or equal to 0.05 mm and less than or equal to 1 mm. When the mean pore size is greater than or equal to 0.05 mm, the flow rate of gas is less likely to be short. When the mean pore size is less than or equal to 1 mm, a potential difference is less likely to occur in the electrically conductive porous body, so it is possible to reduce discharge in the electrically conductive porous body. The porosity of the electrically conductive porous body may be higher than or equal to 30% and may be lower than or equal to 70%.

In the above-described embodiment, each gas second passage 62 has the recessed groove 31 (first recessed portion) provided on the top surface of the electrically conductive plate 30 and formed by disposing the bottom surface (flat surface) of the electrically conductive bonding layer 40 on the recessed groove 31; however, the configuration is not limited thereto. For example, each gas second passage 62 may have a recessed groove (second recessed portion) provided on the bottom surface of the electrically conductive bonding layer 40, and the top surface (flat surface) of the electrically conductive plate 30 may be disposed under the recessed groove. Alternatively, the electrically conductive bonding layer 40 may have a top and bottom two-layer structure, a groove (a groove extending through in the up and down direction) that will be finally the gas second passage 62 may be provided in the bottom layer, and the above-described bonding layer penetrating part 64 may be provided in the top layer. In this case as well, when the electrically conductive gas passage part 70 is provided inside the gas introduction passage 60 (bonding layer penetrating part 64) and the electrically conductive gas passage part 70 is provided so as to be in contact with the bottom surface of the porous plug 55 and is electrically continuous with the electrically conductive plate 30, it is possible to reduce discharge in an area around the electrically conductive plate 30-side end of the porous plug 55.

Figure 9:
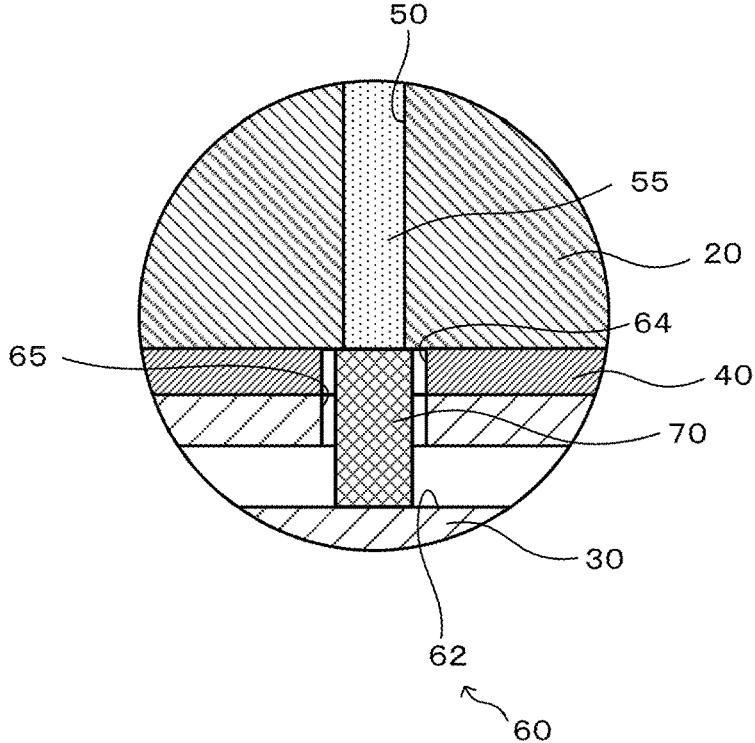
FIG. 9 is a partially enlarged sectional view that shows another example of the electrically conductive gas passage part 70 and the gas introduction passage 60.

In the above-described embodiment, the gas second passage 62 may be incorporated in the electrically conductive plate 30 instead of being provided at the interface between the electrically conductive bonding layer 40 and the electrically conductive plate 30. For example, as shown in FIG. 9, the gas second passage 62 may be incorporated in the electrically conductive plate 30, and a gas third passage 65 that is a hole that communicates the gas second passage 62 with the bonding layer penetrating part 64 in the up and down direction may be provided in the electrically conductive plate 30. With this configuration as well, as in the case of the above-described embodiment, since the electrically conductive gas passage part 70 is present, it is possible to further reliably reduce discharge in an area around the electrically conductive plate 30-side end of the porous plug 55. When the wafer placement table 10 in which the gas second passage 62 is incorporated in the electrically conductive plate 30 is manufactured, a first MMC disk member having a through-hole that will be the gas third passage 65 and a second MMC disk member having a recessed groove 32a that will be the refrigerant flow channel 32 and a through-hole 61a that will be part of the gas first passage 61 may be used instead of the MMC disk member 81 shown in FIGS. 7A to 7F. At least one of the bottom surface of the first MMC disk member or the top surface of the second MMC disk member just needs to have a recessed groove that will be the gas second passage 62.

In the above-described embodiment, the gas second passage 62 and the gas auxiliary passage 63 may be omitted, and the plurality of gas first passages 61 and the plurality of ceramic plate penetrating parts 50 may communicate in a one-to-one correspondence with each other.

Figure 10:
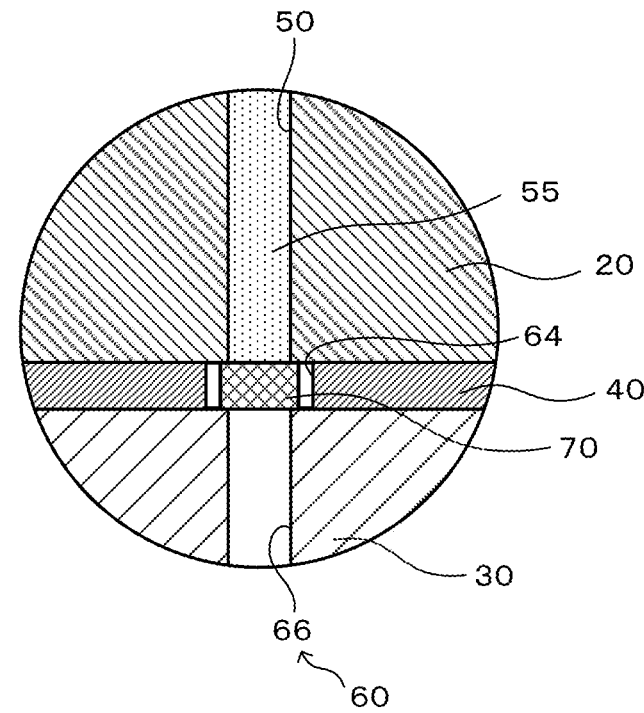
FIG. 10 is a partially enlarged sectional view that shows another example of the electrically conductive gas passage part 70 and the gas introduction passage 60.

In the above-described embodiment, as shown in FIG. 3, gas horizontally flowing through the gas second passage 62 flows into the electrically conductive gas passage part 70; however, the direction in which gas flows is not limited thereto. For example, as shown in FIG. 10, the gas introduction passage 60 may have a gas fourth passage 66 provided just below the electrically conductive gas passage part 70 and having a smaller diameter than the electrically conductive gas passage part 70, and gas heading upward from the gas fourth passage 66 may flow into the electrically conductive gas passage part 70. The electrically conductive gas passage part 70 of FIG. 10 is disposed inside the bonding layer penetrating part 64 in the gas introduction passage 60 and is in contact with the bottom surface of the porous plug 55 and the top surface of the electrically conductive plate 30. The gas fourth passage 66, as well as the gas third passage 65 of FIG. 9, may be a hole that communicates with the gas second passage 62. Alternatively, the gas second passage 62 and the gas auxiliary passage 63 may be omitted in the gas introduction passage 60, and the gas fourth passage 66 may be a hole that communicates with the gas first passage 61 or may be part of the gas first passage 61.

In the above-described embodiment, the diameter of the electrically conductive gas passage part 70 may be the same as the diameter of the porous plug 55. With this configuration as well, when the electrically conductive gas passage part 70 and the porous plug 55 are disposed such that the outline of the electrically conductive gas passage part 70 and the outline of the porous plug 55 coincide with each other when imaginarily seen through from above, the electrically conductive gas passage part 70 can be disposed so as to overlap the entire bottom surface of the porous plug 55. The diameter of the electrically conductive gas passage part 70 may be less than the diameter of the porous plug 55. In this case, part of the bottom surface of the porous plug 55 may be brought into contact with the top surface of the electrically conductive bonding layer 40 by reducing the diameter of the bonding layer penetrating part 64 as compared to the diameter of the porous plug 55.

In the above-described embodiment, the electrically conductive gas passage part 70 is a substantially circular columnar member having a circular shape in a top view; however, the configuration is not limited thereto. For example, the electrically conductive gas passage part 70 may be a substantially rectangular parallelepiped (including a cubic shape) member.

In the above-described embodiment, the electrically conductive gas passage part 70 is in contact with the electrically conductive plate 30, so the electrically conductive gas passage part 70 is electrically continuous with the electrically conductive plate 30; however, the configuration is not limited thereto. For example, the electrically conductive gas passage part 70 may be in contact with the electrically conductive bonding layer 40 and may be spaced apart from the electrically conductive plate 30, and the electrically conductive gas passage part 70 may be electrically continuous with the electrically conductive plate 30 via the electrically conductive bonding layer 40.

In the above-described embodiment, the upper surface of the porous plug 55 has the same level as the reference surface 21c of the wafer placement surface 21; however, the configuration is not limited thereto. For example, a difference obtained by subtracting the height of the upper surface of the porous plug 55 from the height of the reference surface 21c of the wafer placement surface 21 may be less than or equal to 0.5 mm (preferably less than or equal to 0.2 mm, more preferably less than or equal to 0.1 mm). In other words, the upper surface of the porous plug 55 may be disposed at a position lower by 0.5 mm or less (preferably 0.2 mm or less, more preferably 0.1 mm or less) than the reference surface 21c of the wafer placement surface 21. With this configuration as well, the height of the space between the lower surface of a wafer W and the upper surface of the porous plug 55 is suppressed to a relatively low height. Therefore, it is possible to prevent occurrence of glow discharge and, by extension, arc discharge in this space.

In the above-described embodiment, the bottom surface of the porous plug 55 has the same level as the bottom surface of the ceramic plate 20; however, the configuration is not limited thereto. For example, the lower end of the porous plug 55 may protrude downward from the bottom surface of the ceramic plate 20, or the lower end of the porous plug 55 may be located above the bottom surface of the ceramic plate 20 and the electrically conductive gas passage part 70 may be in contact with the bottom surface of the porous plug 55 inside the ceramic plate penetrating part 50.

In the above-described embodiment, when the wafer placement table 10 is manufactured, the porous plug 55 prepared in advance is inserted into the ceramic plate penetrating part 50; however, the configuration is not limited thereto. For example, before the ceramic plate 20 is joined to the MMC disk member 81 and the MMC disk member 82, a paste-like ceramic mixture that will be a precursor of the porous plug 55 may be injected into the ceramic plate penetrating part 50 of the ceramic plate 20 and fired to form the porous plug 55. In this case, when the ceramic plate 20, the MMC disk member 81, and the MMC disk member 82 are laminated, the bottom surface of the porous plug 55 and the electrically conductive gas passage part 70 just need to be brought into contact with each other.

Figure 11:
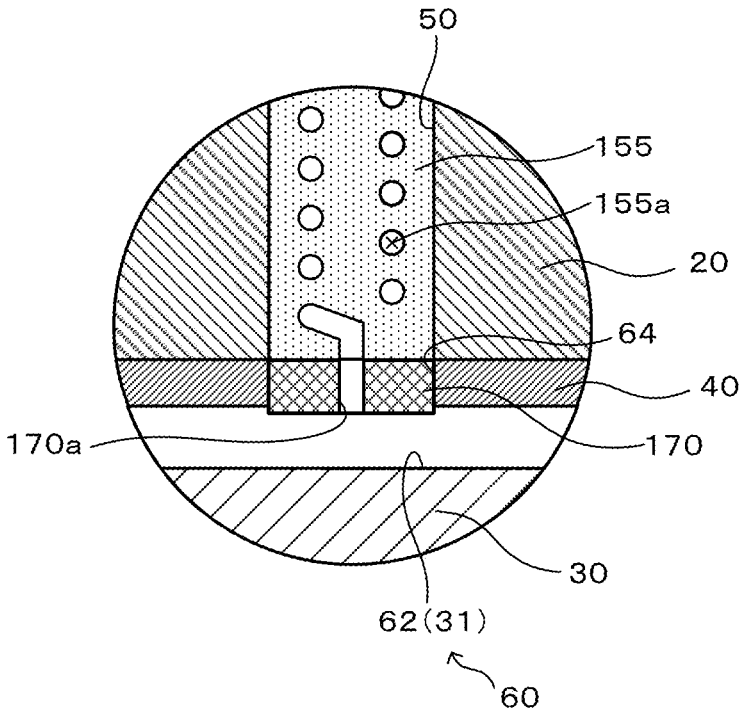
FIG. 11 is a partially enlarged sectional view that shows a dense plug 155 and an electrically conductive gas passage part 170.

In the above-described embodiment, the porous plug 55 is provided in the ceramic plate penetrating part 50; however, the configuration is not limited to a porous body like the porous plug 55. An electrically insulating gas passage plug that allows gas to pass just needs to be provided in the ceramic plate penetrating part 50. For example, an electrically insulating dense plug 155 having a gas internal flow channel 155a as shown in FIG. 11 may be used as the electrically insulating gas passage plug. The gas internal flow channel 155a is a flow channel that allows flow of gas between the top surface side and bottom surface side of the dense plug 155. The gas internal flow channel 155a is a passage that extends through from the top surface side to the bottom surface side of the dense plug 155 while being bent, and, more specifically, configured as a spiral passage. Another example of the passage that extends through while being bent includes a zigzag passage. The gas internal flow channel 155a may be a through-hole in a straight line in the up and down direction. The diameter of the flow channel cross section of the gas internal flow channel 155a is preferably greater than or equal to 0.1 mm and less than or equal to 1 mm. The single dense plug 155 may have a plurality of the gas internal flow channels 155a. The porosity of a dense part of the dense plug 155 is preferably lower than 0.1%. As in the case of the porous plug 55, for example, ceramics, such as alumina and aluminum nitride, may be used as the dense plug 155. The dense plug 155 may be manufactured by, for example, firing a molded body molded by using a 3D printer or firing a molded body molded by mold cast. The details of the dense plug 155 having a gas internal flow channel that extends through while being bent, and mold cast are described in, for example, Japanese Patent No. 7149914 or the like. When the dense plug 155 is provided in the ceramic plate penetrating part 50 instead of the porous plug 55 as well, it is possible to reduce discharge in the ceramic plate penetrating part 50 as in the case of the above-described embodiment.

In the above-described embodiment, the electrically conductive gas passage part 70 may be a coating layer that coats the bottom surface of the electrically insulating gas passage plug. For example, an electrically conductive gas passage part 170 shown in FIG. 11 is formed as a coating layer that coats the bottom surface of the dense plug 155. The electrically conductive gas passage part 170 is formed as a dense layer and has a hole 170a that allows gas to pass in the up and down direction. The hole 170a communicates the opening of the gas internal flow channel 155a on the bottom surface of the dense plug 155 with the gas introduction passage 60. The electrically conductive gas passage part 170 can be manufactured by, for example, forming a coating layer by sputtering, electroless plating, or the like in advance on the bottom surface of the dense plug 155 before the dense plug 155 is attached to the ceramic plate 20 and then perforating the hole 170a. The material of the electrically conductive gas passage part 170 is, for example, a metal material and is preferably a metal excellent in anti-corrosion, such as Au, Ag, and Al. When the electrically conductive gas passage part 170 is a coating layer that coats the bottom surface of the dense plug 155 in this way as well, the electrically conductive gas passage part 170 is in contact with the bottom surface of the dense plug 155 and is electrically continuous with the electrically conductive plate 30, so it is possible to reduce discharge in an area around the lower end of the dense plug 155. The diameter of the hole 170a is preferably greater than or equal to 0.1 mm and less than or equal to 1 mm. In FIG. 11, the electrically conductive gas passage part 170 is not directly in contact with the electrically conductive plate 30 but is in contact with the electrically conductive bonding layer 40 and is electrically continuous with the electrically conductive plate 30 via the electrically conductive bonding layer 40.

The electrically conductive gas passage part 170 is not limited to a dense layer and may be a porous layer. In this case, as long as gas is allowed to pass through a porous part in the electrically conductive gas passage part 170, the hole 170a does not need to be formed. The electrically conductive gas passage part 170 serving as a metal porous layer can be formed on the bottom surface of the dense plug 155 by, for example, using porous plating.

In FIG. 11, the bottom surface of the dense plug 155 is coated with the electrically conductive gas passage part 170. Alternatively, the electrically conductive gas passage part 170 may be formed so as to coat the bottom surface of the porous plug 55. In this case, the electrically conductive gas passage part 170 is preferably a porous layer. When the electrically conductive gas passage part 170 is formed on the bottom surface of the porous plug 55 by sputtering or the like, part of constituent particles of the electrically conductive gas passage part 170 may be involved inside the pores of the porous plug 55.

In the above-described embodiment and another example, the electrically conductive gas passage part 70 has been described as a single member. Alternatively, the electrically conductive gas passage part 70 may be made up of a plurality of members. For example, the electrically conductive gas passage part 70 may have at least one or more of the above-described stretch member, electrically conductive mesh, clump body of electrically conductive fiber, electrically conductive bulk body, electrically conductive porous body, and a coating layer that coats the bottom surface of the electrically insulating gas passage plug. The electrically conductive gas passage part 70 may have two or more of members of different types of these in combination or may have two or more of members of the same types. When the electrically conductive gas passage part 70 has a plurality of members in this way as well, it is applicable that the plurality of members is electrically continuous with each other and the electrically conductive gas passage part 70 is electrically continuous with the electrically conductive plate as a whole and allows gas to pass inside. When the electrically conductive gas passage part 70 has a plurality of members, any one of the plurality of members just needs to be in contact with the bottom surface of the electrically insulating gas passage plug. When the electrically conductive gas passage part 70 is made up of a plurality of members including a stretch member, the electrically conductive gas passage part 70 just needs to be pressed against the bottom surface of the electrically insulating gas passage plug to compress the stretch member, and the stretch member does not need to be in direct contact with the bottom surface of the electrically insulating gas passage plug to be pressed.

Figure 12:
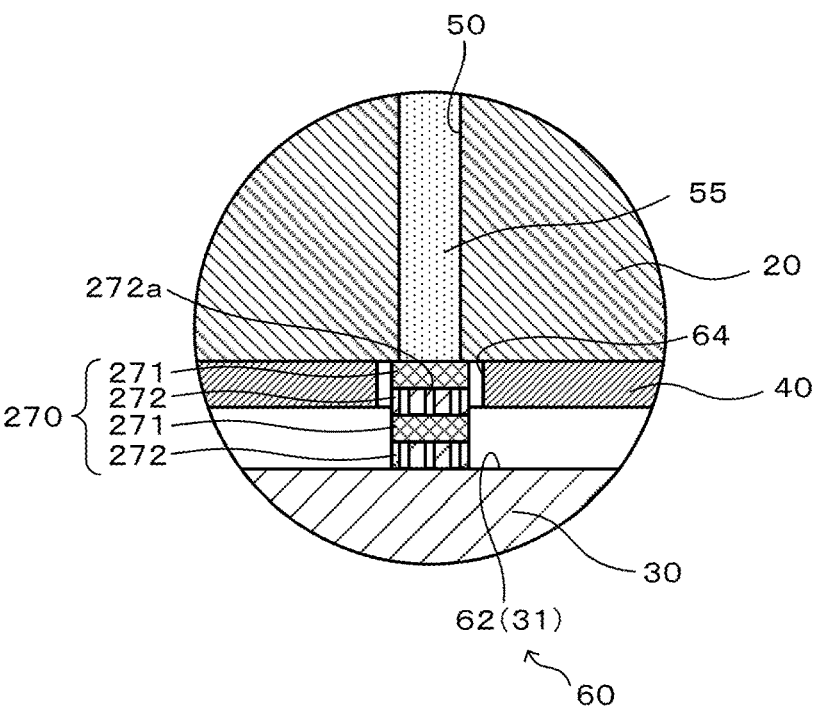
FIG. 12 is a partially enlarged sectional view that shows an area around an electrically conductive gas passage part 270.

For example, the electrically conductive gas passage part may have a structure in which one or more electrically conductive meshes and one or more electrically conductive sheets having a hole that allows gas to pass in the up and down direction are laminated. An electrically conductive gas passage part 270 shown in FIG. 12 has a plurality of electrically conductive gas passage members and, specifically, has a plurality of (here, two) meshes 271 and a plurality of (here, two) electrically conductive sheets 272. The plurality of meshes 271 and the plurality of electrically conductive sheets 272 are alternately laminated in the up and down direction. A similar material to that of the electrically conductive mesh described as the example of the above-described electrically conductive gas passage part 70 may be used as the meshes 271. The electrically conductive sheet 272 is an example of an electrically conductive bulk body. A similar material to that of the electrically conductive gas passage part 70 that is the electrically conductive bulk body shown in FIG. 8 may be used for the electrically conductive sheet 272. The electrically conductive sheet 272 just needs to have one or more holes 272a that allow gas to pass in the up and down direction. In FIG. 12, the electrically conductive sheet 272 has a plurality of (only three holes are shown)

holes 272a. The diameter of the hole 272a, as well as the hole 70a, is preferably greater than or equal to 0.1 mm and less than or equal to 1 mm. The thickness of the electrically conductive sheet 272 may be, for example, greater than or equal to 0.01 mm and less than or equal to 2 mm. In the electrically conductive gas passage part 270, the top surface of the uppermost mesh 271 is in contact with the bottom surface of the porous plug 55, and the bottom surface of the lowermost electrically conductive sheet 272 is in contact with the electrically conductive plate 30. Each of the plurality of meshes 271 is pressed against the bottom surface of the porous plug 55 to be compressed. The electrically conductive gas passage part 270 may include the above-described electrically conductive porous body instead of the electrically conductive sheet 272. In other words, the electrically conductive gas passage part 270 may have a structure in which one or more meshes 271 and one or more electrically conductive porous bodies are laminated in the up and down direction. Since the electrically conductive gas passage part 270 has a structure in which a stretch member, such as the mesh 271, and a non-stretch member, such as the electrically conductive sheet 272 and the electrically conductive porous body, are laminated, the overall thickness of the electrically conductive gas passage part 270 is easily adjusted to a desired value with the thickness of the non-stretch member. The electrically conductive gas passage part 270 may be a laminated body in which the electrically conductive sheet 272 is not provided and the plurality of meshes 271 is laminated in the up and down direction.

Figure 13:
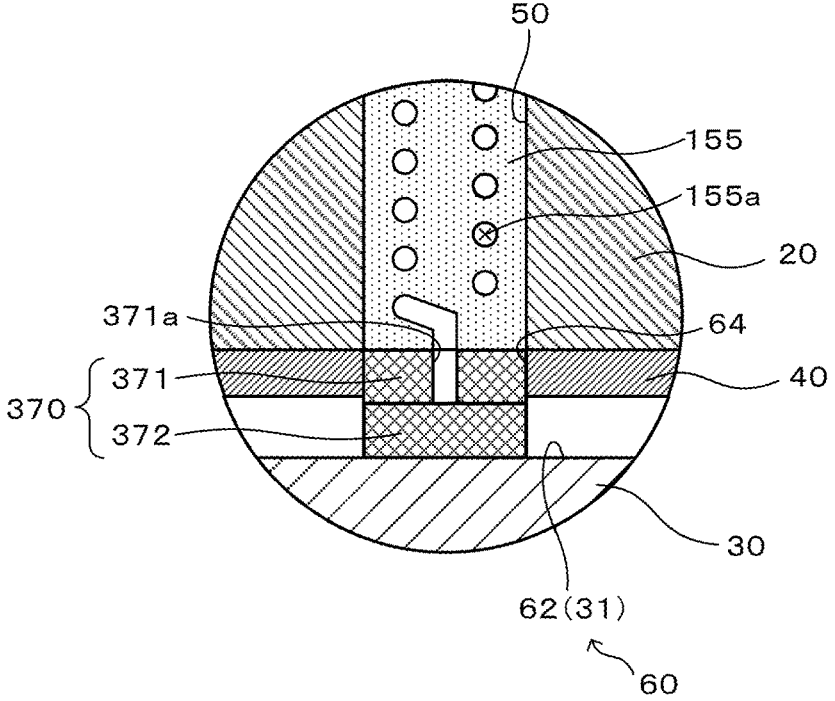
FIG. 13 is a partially enlarged sectional view that shows an area around an electrically conductive gas passage part 370.

For example, the electrically conductive gas passage part may have a plurality of electrically conductive gas passage members including a coating layer that coats the bottom surface of the electrically insulating gas passage plug. An electrically conductive gas passage part 370 shown in FIG. 13 has a coating layer 371 and a mesh 372 as a plurality of electrically conductive gas passage members. The coating layer 371, as well as the electrically conductive gas passage part 170 of FIG. 11, coats the bottom surface of the dense plug 155. The coating layer 371 has a hole 371a similar to the hole 170a. The top surface of the mesh 372 is in contact with the bottom surface of the coating layer 371. A similar material to that of the electrically conductive mesh described as the example of the above-described electrically conductive gas passage part 70 may be used as the mesh 372. In the electrically conductive gas passage part 370, the coating layer 371 is in contact with the bottom surface of the dense plug 155, and the bottom surface of the mesh 372 is in contact with the electrically conductive plate 30. The electrically conductive gas passage part 370 may have any one of a stretch member, a clump body of electrically conductive fiber, an electrically conductive bulk body, and an electrically conductive porous body, instead of the mesh 372.

In the above-described embodiment, the ceramic plate 20 and the electrically conductive plate 30 are joined by the electrically conductive bonding layer 40. Alternatively, a non-bonding layer, such as a resin bonding layer, may be used instead of the electrically conductive bonding layer 40. In this case, a metal, such as Al and Ti, may be used as the electrically conductive plate.

In the above-described embodiment, the electrostatic electrode is incorporated in the ceramic plate 20 as the electrode 22. Instead of or in addition to this, a heater electrode (resistance heating element) may be incorporated. In this case, a heater power supply is connected to the heater electrode. The ceramic plate 20 may incorporate one layer of electrode or may incorporate two or more layers of electrode with a gap.

In the above-described embodiment, lift pin holes extending through the wafer placement table 10 may be provided. The lift pin holes are holes for allowing insertion of lift pins used to raise and lower a wafer W with respect to the wafer placement surface 21. The lift pin holes are provided at three locations when a wafer W is supported by, for example, three lift pins.

In the above-described embodiment, the ceramic plate 20 is made by firing a ceramic powder molded body by hot pressing. The molded body at that time may be made by laminating a plurality of tape molds, or may be made by mold casting, or may be made by compacting ceramic powder.

In the above-described embodiment, the electrically conductive gas passage part 70 may be an elastic body. Examples of the elastic body include an electrically conductive spring. Examples of the material of the spring include metal materials (Al, Ti, Mo, or alloys of them, and steel) listed in the above-described embodiment. The elastic body is preferably disposed in a state of pressing the electrically insulating gas passage plug upward with an elastic force. Thus, contact between the electrically conductive gas passage part and the electrically insulating gas passage plug is easily maintained. When the above-described electrically conductive gas passage part 70 has a plurality of electrically conductive gas passage members, one or more of the plurality of electrically conductive gas passage members may be elastic bodies. For example, the electrically conductive gas passage part 70 may have an elastic body and one or more of the above-described various members. When the electrically conductive gas passage part 70 has a plurality of electrically conductive gas passage members including an elastic body, the elastic body itself does not need to be in direct contact with the electrically insulating gas passage plug to press the electrically insulating gas passage plug, and the electrically conductive gas passage part 70 just needs to press the electrically insulating gas passage plug upward with the elastic force of the elastic body.

Figure 14:
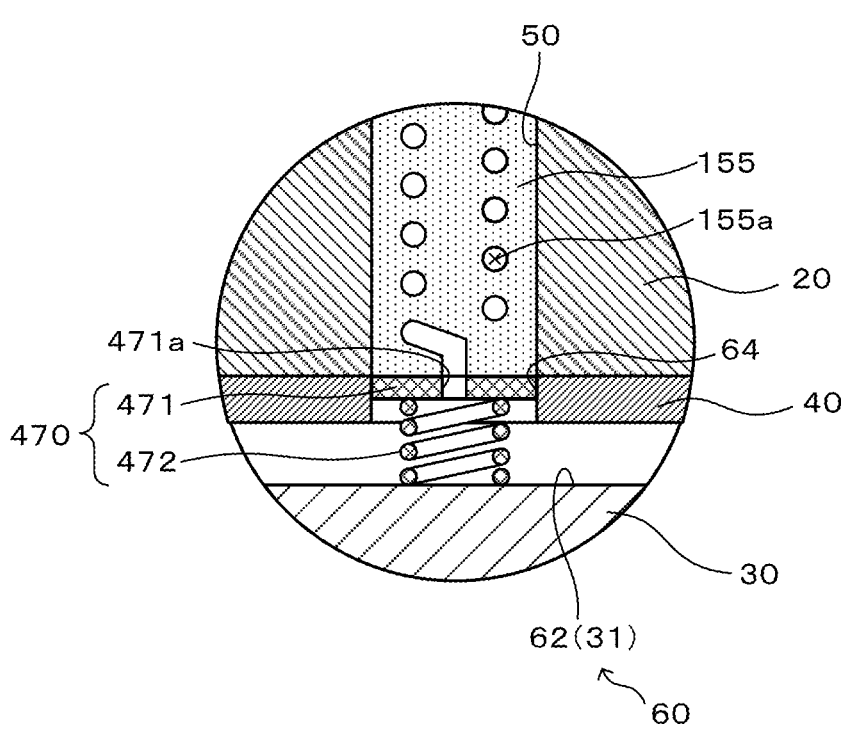
FIG. 14 is a partially enlarged sectional view that shows an area around an electrically conductive gas passage part 470.

For example, the electrically conductive gas passage part 40 may have a coating layer that coats the bottom surface of the electrically insulating gas passage plug and an elastic body that presses the coating layer upward with an elastic force. An electrically conductive gas passage part 470 shown in FIG. 14 has a coating layer 471 and an elastic body 472 as a plurality of electrically conductive gas passage members. The coating layer 471, as in the case of the electrically conductive gas passage part 170 of FIG. 11 and the coating layer 371 of FIG. 13, coats the bottom surface of the dense plug 155 to be in contact with the bottom surface of the dense plug 155. The coating layer 471 has a hole 471a similar to the hole 371a. The coating layer 471 is a layer formed by sputtering in advance on the bottom surface of the dense plug 155. The material of the coating layer 471 is Ti. A similar material to that of the above-described electrically conductive gas passage part 170 may be used as the material of the coating layer 471. The elastic body 472 is an electrically conductive spring, and the top surface of the elastic body 472 is in contact with the bottom surface of the coating layer 471. The bottom surface of the elastic body 472 is in contact with the electrically conductive plate 30. The elastic body 472 allows gas to pass inside. Specifically, gas is allowed to pass in a direction along the central axis of the elastic body 472 (up and down direction), any gap between wires of the spring that makes up the elastic body 472, and the like. The elastic body 472 is disposed inside the wafer placement table 10 in a state of being compressed from a natural length and presses the coating layer 471 and the dense plug 155 upward with an elastic force. Similarly, the elastic body 472 presses the electrically conductive plate 30 downward with an elastic force. The coating layer 471 and the elastic body 472 are in contact with each other and are electrically continuous with each other, and the elastic body 472 and the electrically conductive plate 30 are in contact with each other and are electrically continuous with each other. With the electrically conductive gas passage part 470 configured in this way, the elastic body 472 presses the bottom surface of the coating layer 471 upward with an elastic force, so contact between the electrically conductive gas passage part 470 and the dense plug 155 is easily maintained. Thus, the electrically conductive gas passage part 470 having the same potential as the electrically conductive plate 30 is further reliably in contact with the dense plug 155, so it is possible to further reduce discharge in an area around the electrically conductive plate 30-side end of the dense plug 155, that is, an area around the lower end of the dense plug 155.

In the above-described embodiment, a mode in which the porous plug 55 is screwed to the ceramic plate 20 has been illustrated. In the above-described modification, a mode in which a paste-like ceramic mixture that will be a precursor of the porous plug 55 is injected into the ceramic plate 20 and then fired to form the porous plug 55 has been illustrated. In these modes, the porous plug 55 and the ceramic plate 20 are in direct contact with each other. In these ways, the electrically insulating gas passage plug may be provided in the ceramic plate penetrating part so as to be in direct contact with the ceramic plate. With this configuration, no adhesive, such as a resin, for bonding the electrically insulating gas passage plug with the ceramic plate needs to be used. The electrically insulating gas passage plug may be a member having a shape of which the area of the bottom surface is greater than the area of the top surface (for example, a truncated cone). In this case, the ceramic plate can be formed such that the ceramic plate penetrating part has a shape that is suited for the electrically insulating gas passage plug (a shape of which the cross-sectional area of the lower part is greater than the cross-sectional area of the upper part), the electrically insulating gas passage plug can be inserted from the bottom surface of the ceramic plate into the ceramic plate penetrating part in advance, and then the ceramic plate and the electrically conductive plate can be joined to each other. With this mode as well, the electrically insulating gas passage plug can be provided in the ceramic plate penetrating part so as to be in direct contact with the ceramic plate, so no adhesive is needed.

The present application claims priority to International Application No. PCT/JP2023/002417 filed on Jan. 26, 2023, the entire contents of which are incorporated herein by reference. International Application No. PCT/JP2023/031890, filed on Aug. 31, 2023, is incorporated herein by reference in its entirety.

What is claimed is:

1. A wafer placement table comprising:
   a ceramic plate having a wafer placement surface on its top surface and incorporating an electrode;
   an electrically conductive plate joined to a bottom surface of the ceramic plate;
   a ceramic plate penetrating part extending through the ceramic plate;
   an electrically insulating gas passage plug provided at the ceramic plate penetrating part, gas being allowed to pass through an inside of the electrically insulating gas passage plug;

a gas introduction passage provided at least inside the electrically conductive plate, the gas introduction passage communicating with the ceramic plate penetrating part; and an electrically conductive gas passage part provided in the gas introduction passage, the electrically conductive gas passage part being in contact with a bottom surface of the electrically insulating gas passage plug, the electrically conductive gas passage part being electrically continuous with the electrically conductive plate, the electrically conductive gas passage part allowing gas to pass inside.

2. The wafer placement table according to claim 1, wherein the electrically conductive gas passage part is provided separately from the electrically conductive plate.

3. The wafer placement table according to claim 2, wherein the electrically conductive gas passage part has a stretch member, and the stretch member is pressed against the bottom surface of the electrically insulating gas passage plug to be compressed.

4. The wafer placement table according to claim 2, wherein the electrically conductive gas passage part has at least one of an electrically conductive mesh or a clump body of electrically conductive fiber.

5. The wafer placement table according to claim 2, wherein the electrically conductive gas passage part has a structure in which one or more electrically conductive meshes and one or more electrically conductive sheets having a hole that allows gas to pass in an up and down direction are laminated, and a diameter of the hole is greater than or equal to 0.1 mm and less than or equal to 1 mm.

6. The wafer placement table according to claim 1, wherein the electrically conductive gas passage part has an electrically conductive bulk body having a hole through which gas is allowed to pass in an up and down direction, and a diameter of the hole is greater than or equal to 0.1 mm and less than or equal to 1 mm.

7. The wafer placement table according to claim 1, wherein the electrically conductive gas passage part has an electrically conductive porous body.

8. The wafer placement table according to claim 1, wherein the electrically conductive gas passage part is disposed so as to overlap an entire bottom surface of the electrically insulating gas passage plug when imaginarily seen through from above.

9. The wafer placement table according to claim 1, wherein the electrically insulating gas passage plug is a porous body.

10. The wafer placement table according to claim 1, wherein the electrically conductive gas passage part has a coating layer that coats the bottom surface of the electrically insulating gas passage plug.

11. The wafer placement table according to claim 1, wherein the electrically conductive gas passage part has a coating layer that coats the bottom surface of the electrically insulating gas passage plug and an elastic body that presses the coating layer upward with an elastic force.

* * * * *